US010979048B2

(12) United States Patent
Matalon

(10) Patent No.: US 10,979,048 B2
(45) Date of Patent: Apr. 13, 2021

(54) CLOCK SWITCHING CIRCUIT AND METHOD

(71) Applicant: SEMICONDUCTOR COMPONENTS INDUSTRIES, LLC, Phoenix, AZ (US)

(72) Inventor: Jonathan Matalon, Toulouse (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/670,067

(22) Filed: Oct. 31, 2019

(65) Prior Publication Data
US 2021/0083666 A1 Mar. 18, 2021

Related U.S. Application Data

(60) Provisional application No. 62/899,940, filed on Sep. 13, 2019.

(51) Int. Cl.
*H03K 19/003* (2006.01)
*H03K 5/135* (2006.01)
*G06F 1/08* (2006.01)

(52) U.S. Cl.
CPC ......... *H03K 19/00346* (2013.01); *G06F 1/08* (2013.01); *H03K 5/135* (2013.01)

(58) Field of Classification Search
CPC ..... G06F 1/08; H03K 19/00346; H03K 5/135
USPC ......................................................... 327/291
See application file for complete search history.

(56) References Cited

U.S. PATENT DOCUMENTS

| 5,142,247 | A | * | 8/1992 | Lada, Jr. | ................. | H03L 7/18 331/14 |
| 6,633,991 | B1 | * | 10/2003 | Goldrian | ................. | G06F 1/08 370/352 |
| 7,826,563 | B2 | * | 11/2010 | An | ............................. | G06F 7/68 331/16 |
| 9,360,883 | B1 | | 6/2016 | Barman et al. | | |
| 9,654,277 | B2 | * | 5/2017 | Tanno | ................. | H04J 3/0688 |

(Continued)

OTHER PUBLICATIONS

Mahmud, Rafey, "Techniques to make clock switching glitch free" EE Times, Jun. 26, 2003.

*Primary Examiner* — Lincoln D Donovan
*Assistant Examiner* — Colleen J O Toole
(74) *Attorney, Agent, or Firm* — Brake Hughes Bellermann LLP

(57) ABSTRACT

Circuits and methods for switching between an internal clock and an external clock without causing an interruption or an artifact in the switched clock signal are disclosed. To achieve this, the internal clock signal is synchronized with the external clock signal prior to switching. The synchronization may be accomplished using two possible clock-synchronization methods: a first method that passively waits for the clocks to synchronize over time and a second that adjusts a period of the internal clock signal to actively synchronize the clocks. The method selected for use requires the fewest clock cycles to reach synchronization, which is determined by a frequency difference between the two clock frequencies. After clock-synchronization, the output clock signal spectrum will be substantially the same before and after switching between the clock signals, and therefore is suitable for use with spread spectrum clocks.

19 Claims, 14 Drawing Sheets

(56) References Cited

U.S. PATENT DOCUMENTS

2014/0062548 A1 3/2014 Hwang et al.
2018/0145689 A1 5/2018 Lapiana

* cited by examiner

CLOCK SWITCHING CIRCUIT AND METHOD

CROSS-REFERENCE TO RELATED APPLICATIONS

This application claims the benefit of U.S. Provisional Patent Application No. 62/899,940, filed on Sep. 13, 2019, the entire contents of which is incorporated herein by reference.

FIELD OF THE DISCLOSURE

The present disclosure relates to microelectronics and more specifically, to a circuit and method to switch between clock signals.

BACKGROUND

Synchronous electronic applications (i.e., devices) require a clock signal for operation. A clock signal may be obtained from a clock that is integrated with a device (i.e., an internal clock), but in some cases, a clock signal may be obtained from a clock that is separate from the device (i.e., an external clock). When an external clock is coupled to the device, a clock switch that normally routes an internal clock signal to an output of the clock switch may be changed to route an external clock signal to the output of the clock switch. The switching may produce artifacts (e.g., glitches or dropped clock cycles) in the clock signal at the output of the switch. Clock switching circuits and methods are needed to reduce or eliminate the artifacts caused by switching.

SUMMARY

Accordingly, in one general aspect, the present disclosure describes a clock switch. The clock switch includes a phase shift module that is configured to receive an internal clock signal from an internal clock coupled to the clock switch. The phase shift module is further configured to reduce a frequency of the internal clock signal by a controllable divisor. The clock switch further includes a clock-sync controller that is configured to receive the internal clock signal and an external clock signal from an external clock coupled to the clock switch. The clock-sync controller is configured to control the controllable divisor of the phase shift module in order to generate an adjusted internal clock signal at an output of the phase shift module that is synchronized with the external clock signal. The clock switch further includes a multiplexer that is configured to switch an output of the clock switch between the adjusted internal clock signal and the external clock signal upon receiving a sync signal from the clock-sync controller. The sync signal generated by the clock-sync controller after the adjusted internal clock signal is synchronized with the external clock signal.

In another general aspect, the present disclosure describes a method for switching clock signals. The method includes receiving an internal clock signal from an internal clock and dividing a frequency of the internal clock signal by a divisor to generate an adjusted internal clock signal. The method further includes receiving an external clock signal from an external clock. The adjusted internal clock signal and the external clock signal are applied to a multiplexer that is configured to couple the adjusted internal clock signal to an output. The method includes measuring a frequency difference between the internal clock signal and the external clock signal and selecting (based on the frequency difference) either a first method or a second method to synchronize the adjusted internal clock signal with the external clock signal. The selected method is then executed until a synchronization condition is determined. After then synchronization condition is determined, the method include switching the multiplexer to couple the external clock signal to the output.

In another general aspect, the present disclosure describes a synchronous device. The synchronous device includes an internal clock that is configured to provide an internal clock signal. The synchronous device also includes a port capable of coupling to an external clock. The synchronous device further includes a clock switch that is couple to the internal clock and to the port. The clock switch includes circuitry that is configured to reduce a frequency of the internal clock signal by a controllable divisor to generate an adjusted internal clock signal. The circuitry is further configured to couple the adjusted internal clock signal to an output of the clock switch. The circuitry is further configured to detect an external clock signal at the port. The circuitry is further configured to control the controllable divisor to synchronize the adjusted internal clock signal with the external clock signal and to switch the clock switch to couple the external clock signal to the output after the adjusted internal clock signal is synchronized with the external clock signal.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes circuits and methods for switching between an internal clock and an external clock without causing an interruption or an artifact in the switched clock signal. To achieve this, the internal clock signal is synchronized with the external clock signal prior to switching using one of two possible clock synchronization methods (i.e., methods). The selection of the method used is based on a frequency difference between the internal clock signal and the external clock signal, and the selected method will allow for faster synchronization (i.e. in fewer clock cycles) than the unselected method. Neither of the two possible methods for synchronization is visible on a spectrum of the output clock signal regardless of the method used for clock synchronization. Accordingly, no signal modification is required to maintain a spectrum as the external clock signal is switched by a multiplexor to become the output clock signal.

As defined in this disclosure, a clock signal is a square wave signal oscillating between two signal levels at a frequency. A spread spectrum clock signal is a square wave signal that oscillates between two signal levels at a frequency that changes with time. The changes with time are on a time scale larger than the time scales discussed in this disclosure. Accordingly, when a frequency of a clock signal is referred to, the clock signal may or may not be from a spread spectrum clock.

Figure 1:
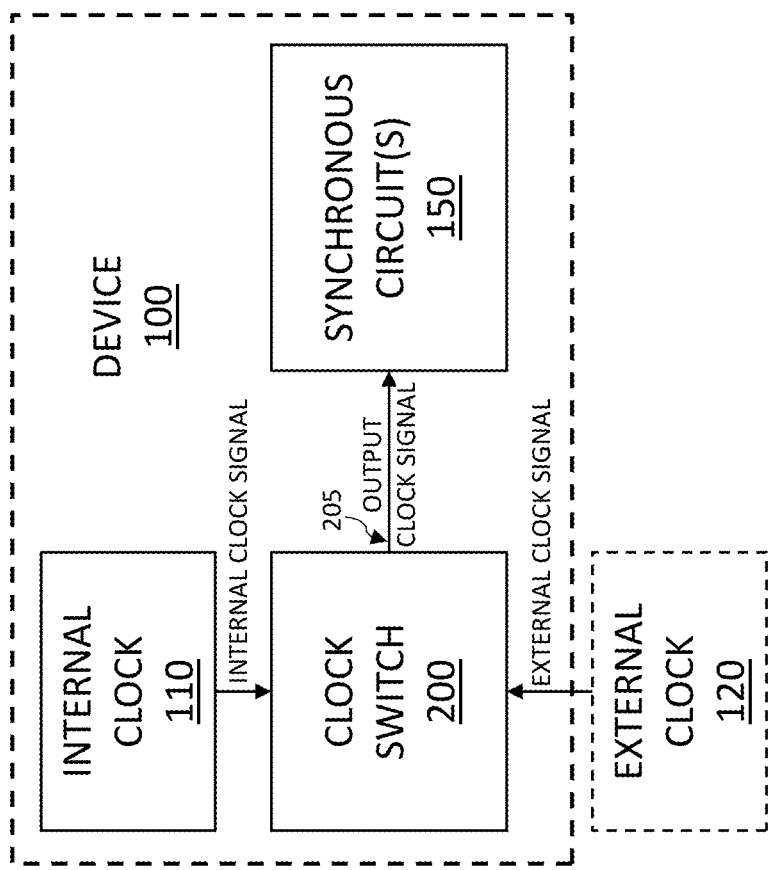
FIG. 1 is a block diagram of a device configured to operate using an internal clock or an external clock according to a possible implementation of the present disclosure.

FIG. 1 is a block diagram of a device 100 (i.e., synchronous device) configured to operate according to a clock signal. Synchronous circuit or circuits 150 of the device 100 utilize a clock signal from a clock switch 200 for operation. For example, the synchronous circuits 150 may include a power converter (DC-DC converter) circuit that relies on the clock signal for switching (e.g., at frequency in the range of 2-2.3 megahertz (MHz)) in order to perform a buck conversion or a boost conversion. In one possible implementation, the device is a synchronous pulse-width-modulation (PWM) buck converter optimized to supply power to different subsystems of an automotive application.

The device 100 can include an internal clock 110 to provide an internal clock signal. The internal clock may be physically integrated with the device 100 (e.g., in the same device package). The device may also include an input (i.e. port, terminal, etc.) for receiving an external clock signal from an external clock 120. The external clock may not be physically integrated with the device 100 and may help synchronize the operation of the device 100 with other devices in a system (e.g., automotive system).

To select which clock signal is used for operation, the device 100 may include a clock switch 200. The clock switch 200 is configured to receive the internal clock signal from the internal clock 110 and the external clock signal from the external clock 120 and to provide an output clock signal at an output 205 that is coupled to the synchronous circuit (or circuits) of the device 100. Accordingly, the clock switch 200 may have at least two states. In a first state, the clock switch 200 couples the internal clock 110 to the output of the clock switch so that the output clock signal is equivalent to the internal clock signal (e.g., is the internal clock signal). In a second state, the clock switch 200 couples the external clock 120 to the output 205 of the clock switch 205 so that the output clock signal is equivalent to the external clock signal (e.g., is the external clock signal). In a possible implementation, the first state of the clock switch 200 is a default switch state because the external clock 120 may not be required for operation. In other words, the internal clock 110 may always be present and available for the device to use for operation, while the external clock 120 may be present or absent.

The switching of the clock switch between the internal clock 110 and the external clock 120 may be based on a set of conditions. Accordingly, the clock switch 200 may include circuitry to determine each of condition as part of switching (e.g., prior to switching).

One possible condition that the clock switch 200 may determine as part of switching (e.g., prior to switching) is a clock-detection condition. In a possible implementation, the clock switch may be configured to detect the presence of the external clock signal and in some cases, to determine if the external clock signal is valid (or invalid) for operation with the synchronous circuits. Accordingly, the clock switch 200 may be enabled to switch between (i.e., to/from) the internal clock and the external clock only when an external clock signal is detected and when the external clock signal is valid (e.g., has a frequency included a range of valid frequencies).

Another possible condition that the clock switch 200 may determine as part of switching (e.g., prior to switching) is a synchronization condition (i.e., sync, phase match condition). In a possible implementation, determining the synchronization condition may include measuring a phase shift between the internal clock signal and the external clock signal and comparing the phase shift to a threshold so a phase shift meeting a threshold condition (e.g., below the threshold) is considered phase matched. In the phase matched condition, the internal and external clocks may be considered synchronized. Accordingly, the clock switch 200 may be configured to switch between the internal clock and the external clock only when the clock signals are phase matched (i.e., synchronized).

Another possible condition that the clock switch 200 may determine as part of switching (e.g., prior to switching) is a level condition. In a possible implementation, determining matching levels of the clock signals may include determining a level of the internal clock signal and a level of the external clock signal. The levels may be determined as either a high signal level (i.e., HIGH) or a low signal level (i.e., LOW). At a particular time, the levels of each clock can be compared to determine a match. The level condition may further require that the levels of the clock signals both be LOW. Accordingly, the clock switch 200 may be configured to switch between the internal clock and the external clock only at a time when the levels of the internal clock signal and the external clock signals are matched. Further, in a possible implementation, switching may occur only at a time when the levels of the clock signals are both LOW.

This approach of requiring a plurality of conditions to be met (e.g., satisfied) before switching between clock signals can reduce or eliminate one or more artifacts in the output clock signal. The one or more artifacts may include a glitch (i.e., spike) in a clock signal. Additionally (or alternatively), the one or more artifacts may include one or more missing clock cycles in the clock signal (e.g., in the square wave signal). Either (or both) of these artifacts can affect the operation of the device 100. For example, one or more missing clock cycles in a power converter may cause a loss of voltage regulation (e.g., voltage drop) at an output of the device. The disclosed circuits and methods do not cause a loss of clock cycles. Additionally, the disclosed circuits and methods do not (e.g., do not significantly) affect the spectrum of the "external clock signal" when the system is locked and provide this clock signal into the "output clock signal." Accordingly, spread spectrum clocks may be switched without losing their beneficial (e.g., low) electromagnetic interference (EMI) properties.

Meeting (e.g., satisfying) one or more of the plurality of conditions before switching can cause a delay while the one or more conditions are met. Minimizing the delay may be important for some applications. The delay may depend on a comparison (e.g., similarity) between frequencies of internal clock signal and the external clock signal Accordingly, methods for meeting one or more of the plurality of conditions can be evaluated based on the number of clock cycles necessary for meeting the one or more criteria versus a measure of similarity between the frequencies of the internal clock signal and the external clock signal.

In a possible implementation, the measure of similarity between the frequencies of the clock signals is based a difference between a frequency of the internal clock signal ($F_{int}$) and a frequency of the external clock signal ($F_{ext}$). In a possible implementation, the difference may be measured as a percent difference ($\Delta F$) which can be expressed by the following equation.

$$\Delta F = \left(\frac{F_{int} - F_{ext}}{F_{int}}\right) \times 100\% \quad (1)$$

There are at least two possible methods that can be used to synchronize the clocks and that the choice of method affects the speed at which the synchronization may occur. A first method for clock synchronization is referred to as the "wait method" or simply as "method 1". Method 1 includes observing the clock signals and waiting for a phase match in order to detect when signals synchronize. A second method for clock synchronization is referred to as the "adjust-period method" or simply as "method 2." Method 2 includes adjusting a period of a portion (e.g., one of the clock signals) of a one of the clock signals (e.g., the internal clock signal) and then determining if the clock signals have synchronized. If not, then a period of a clock signal may be further adjusted (e.g. longer or shorter) and observed for synchronization. This process may be repeated until the clocks have been synchronized.

The disclosed clock switch includes circuitry configured to determine (e.g., choose, identify) which of the two possible methods will be used to meet the criteria for switching. The choice is based on the number of cycles required to reach the phase-match condition (e.g., synchronize the clock signals). In other words, the choice is based on a comparison of the speed at which the methods can result in synchronization.

Figure 2:
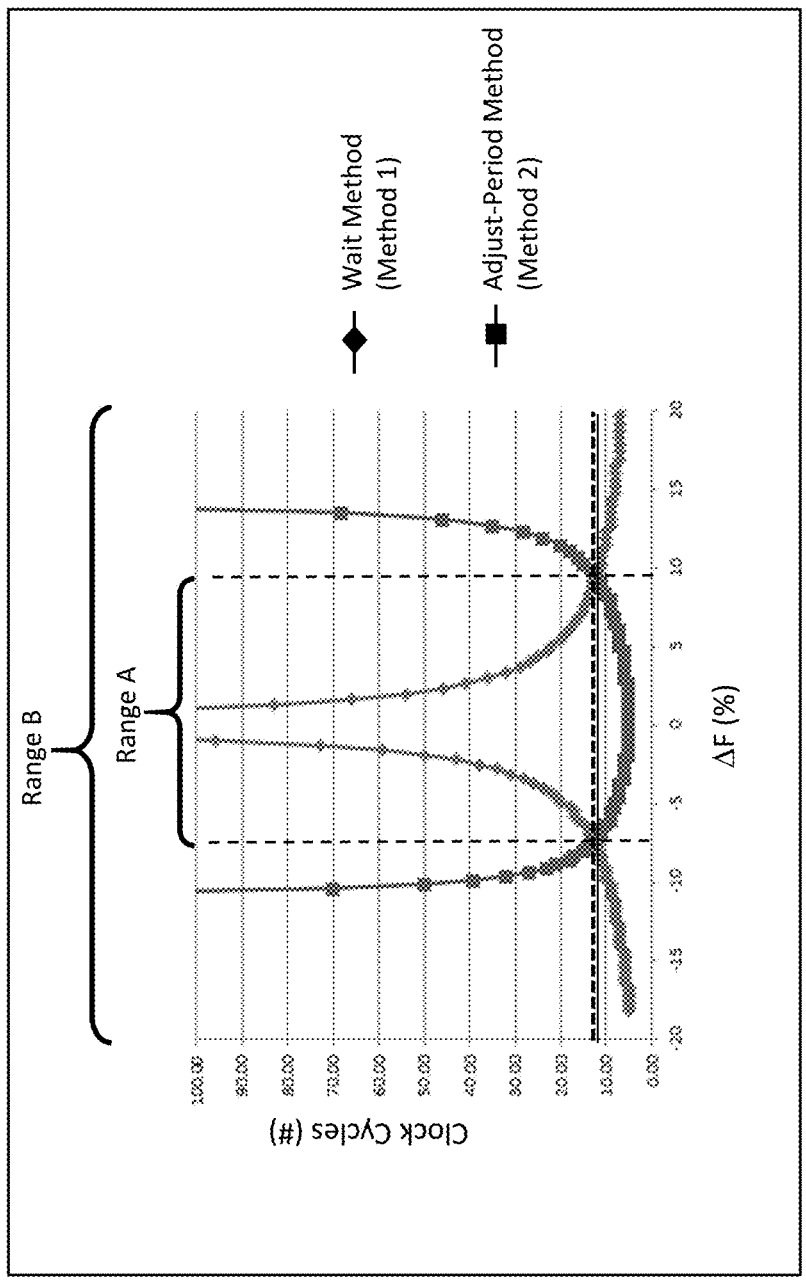
FIG. 2 is a graph of the number of clock cycles required to synchronize versus the percent difference between clock signals as it applies to method selection according to a possible implementation of the present disclosure.

A comparison of the methods is shown in the graph of FIG. 2. The graph shows the number of cycles required for method 1 (plotted as diamonds) and method 2 (plotted as squares) to satisfy the phase-match condition for a range of percent differences ($\Delta F$). As shown, the delay of for method 1 (i.e., the wait method) becomes large (e.g., ≥13 clock cycles) when the percent difference between the clock signal frequencies is small (e.g., $-7\% \leq \Delta F \leq +9\%$) but is small otherwise. The delay for method 2 (i.e., the adjust-period method), conversely, is small (e.g., ≤13 clock cycles) when the percent difference between the clock signal frequencies is small (e.g., $-7\% \leq \Delta F \leq +9\%$) and large (>13 clock cycles) otherwise. Ranges (i.e., Range A, Range B) and thresholds (i.e., shown as dotted lines) may be set using the cross-over points of the two plotted curves. The ranges determined from graphs can be used to determine (i.e., select) a method for satisfying the phase-match condition (i.e., synchronizing the clock signals) prior to switching. For example, if a measure the external clock frequency is in Range A (and in Range B) then method 2 (i.e., the adjust-period method) may be more appropriate (i.e., faster) for synchronizing the clock signals prior to switching.

The clock switch may include circuitry configured to select method 1 or method 2 based on a frequency difference between the internal clock signal and the external clock signal. The approach of selecting a method may help keep a switching delay at or below a maximum value (e.g., 13 clock cycles) for a range of possible frequency differences between the internal clock signal and (a valid) external clock signal. The selection may include determining the clock frequency of each clock and comparing the clock frequencies in order to find a percent difference. In a possible implementation, after a percent difference is found, a determination (i.e., choice) may be made as to which method can reach synchronization faster, whereby the method chosen is the faster method (i.e., the method resulting in fewer clock cycles to reach synchronization).

Figure 3:
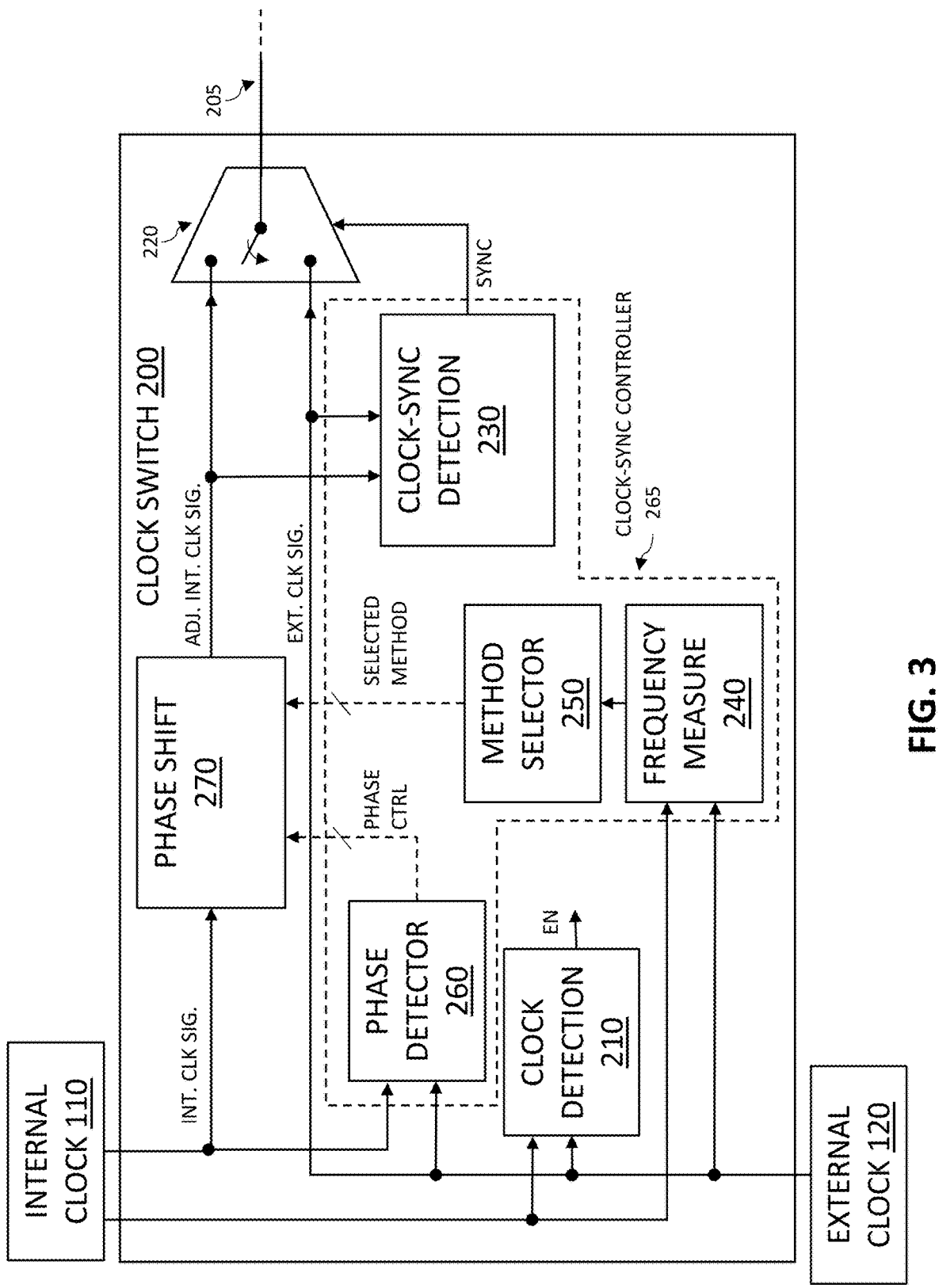
FIG. 3 is a block diagram of a clock switch according to a possible implementation of the present disclosure.

FIG. 3 is a block diagram of a clock switch 200 according to a possible implementation of the present disclosure. The clock switch 200 includes a clock detection module 210. The clock detection module 210 (i.e., circuit) is configured to detect the presence or absence of the external clock 120. The clock detection module 210 is coupled to the internal clock 110 and receives the internal clock signal from the internal clock 110. The clock detection module 210 is also coupled to the external clock 120 and receives the external clock signal from the external clock 120.

Figure 4:
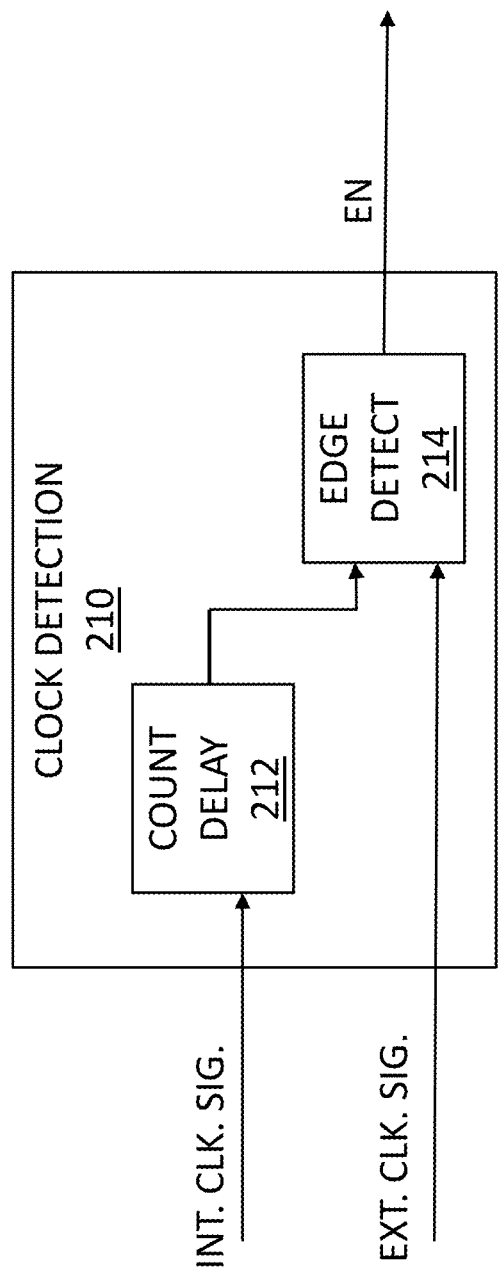
FIG. 4 is a block diagram of a possible clock-detection module for the clock switch of FIG. 3.

Details of a possible implementation of a clock detection module 210 is shown in FIG. 4. The clock detection module 210 may include a count delay subcircuit 212 and an edge detect subcircuit 214. The count delay and edge detect subcircuits are configured to determine if a external clock signal is present (or absent). When an external clock signal is present, the clock detection module 210 may output an enable signal (EN) that can configure other modules of the device to operate. For example, if an external clock signal is not present then the EN signal may turn OFF other modules of the device so that the clock switch outputs a clock signal corresponding to the internal clock.

The clock switch of the possible implementation shown in FIG. 3 also includes a multiplexer 220. The multiplexer 220 receives an adjusted internal clock signal. The internal clock signal may oscillate at a much higher frequency (e.g., 17.2 MHz) than necessary for the synchronous circuit(s) 150 to operate. Accordingly, the multiplexer 220 is coupled to a phase shift module 270, which is configured to reduce in frequency (i.e., divide) the internal clock signal to obtain a lower frequency (e.g., 2.15 MHz) adjusted internal clock signal. When the external clock signal is not present then the clock switch 200 outputs a default (i.e. neutral) adjusted (e.g., divided by 8) internal clock signal.

The multiplexer 220 of the implementation shown in FIG. 3 may also be coupled to a clock-sync detection module 230, which (after being enabled) is configured to pass a synchronous signal (SYNC) to the multiplexer 220 when the phase matched (i.e., sync) condition is met (i.e., after all conditions for switching are met). The multiplexer 220 is configured to, upon receiving the SYNC signal, change states (e.g., pass an external clock signal to the clock switch output 205).

Figure 5:
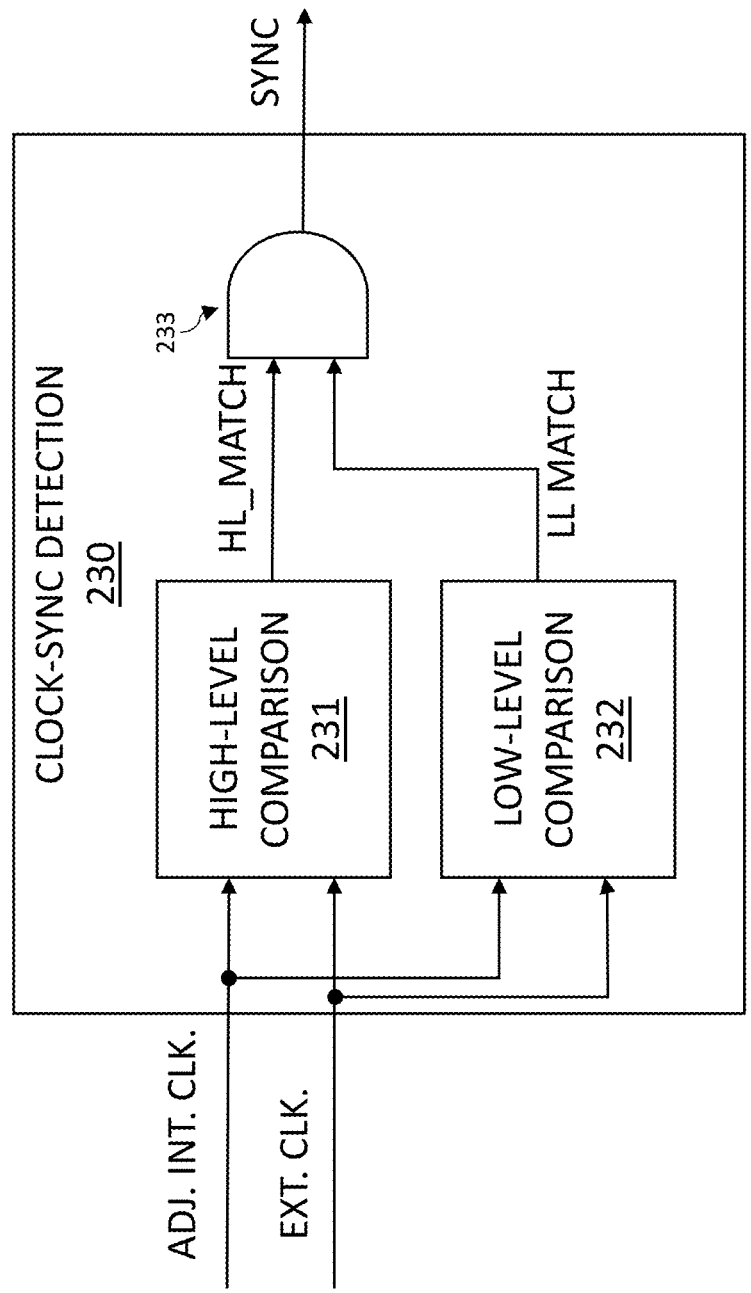
FIG. 5 is a block diagram of a possible clock-sync detection module for the clock switch of FIG. 3.

A possible implementation of a clock-sync detection module 230 is shown in FIG. 5. The clock-sync detection module 230 receives an adjusted internal clock from the phase shift module 270 and an external clock signal from the external clock 120. The clock-sync detection module 230 includes a high-level comparison subcircuit 231 that is configured to determine if the adjusted internal clock is HIGH at the same time as the external clock is HIGH. If this condition is true, then the high-level comparison subcircuit 231 can output a HL_MATCH signal corresponding to true (e.g., a logical high). The clock-sync detection module also includes a low-level comparison subcircuit 232 that is configured to determine if the adjusted internal clock is LOW when the external clock is LOW. If this condition is true then the low-level comparison subcircuit can output a LL_MATCH signal corresponding to true (i.e., a logical high). The clock-sync detection module 230 may also include a logical gate (e.g., AND gate) that outputs a SYNC signal when both the high-level comparison and the low-level comparison conditions are met.

Figure 6:
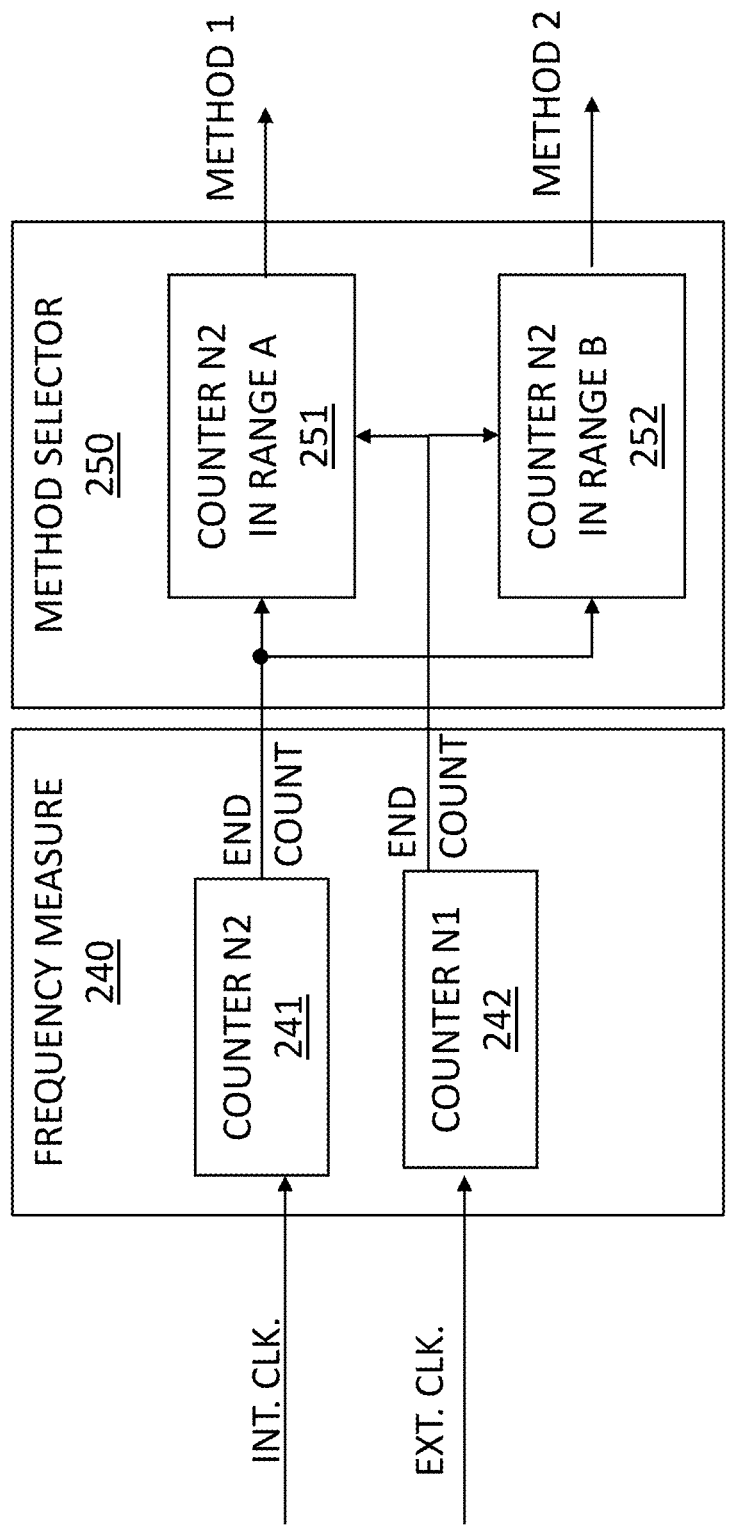
FIG. 6 is a block diagram of a possible frequency measure module and method selector module for the clock switch of FIG. 3.

The clock switch of the possible implementation shown in FIG. 3 also includes a method selector module 250 configured to choose either the wait method (i.e., method 1) or the adjust-period method (i.e., method 2) for clock synchronization prior to switching. FIG. 6 is a block diagram of a possible frequency measure module 240 and method selector module 250 for the clock switch of FIG. 3. The frequency of the external clock can be measured (e.g., for a period) using a first counter subcircuit 242 and the frequency of the internal clock can be measured (e.g., for a period) using a second counter subcircuit 241. The results of the counters may be received by range determination subcircuits that are configured to compare the results of the counters (i.e., the counts) to ranges, and based on the comparison output a signal corresponding to a method when the count is determined to be within in a defined range. The method selector module 250 can include a first range determination subcircuit 251 corresponding to the wait method (i.e., method 1) and can include a second range determination subcircuit 252 corresponding to the adjust-period method (i.e., method 2). The outputs of the range determination subcircuits may be used by other modules to activate functions associated with each method.

The clock-sync detection module 230, the frequency measure module 240, the method selector module 250, and the phase detector module 260 may operate as a clock-sync controller 265 that can control the phase shift module 270 to adjust the internal clock signal until a clock synchronization is detected, and once detected, controls the multiplexer 220 to switch.

Figure 7:
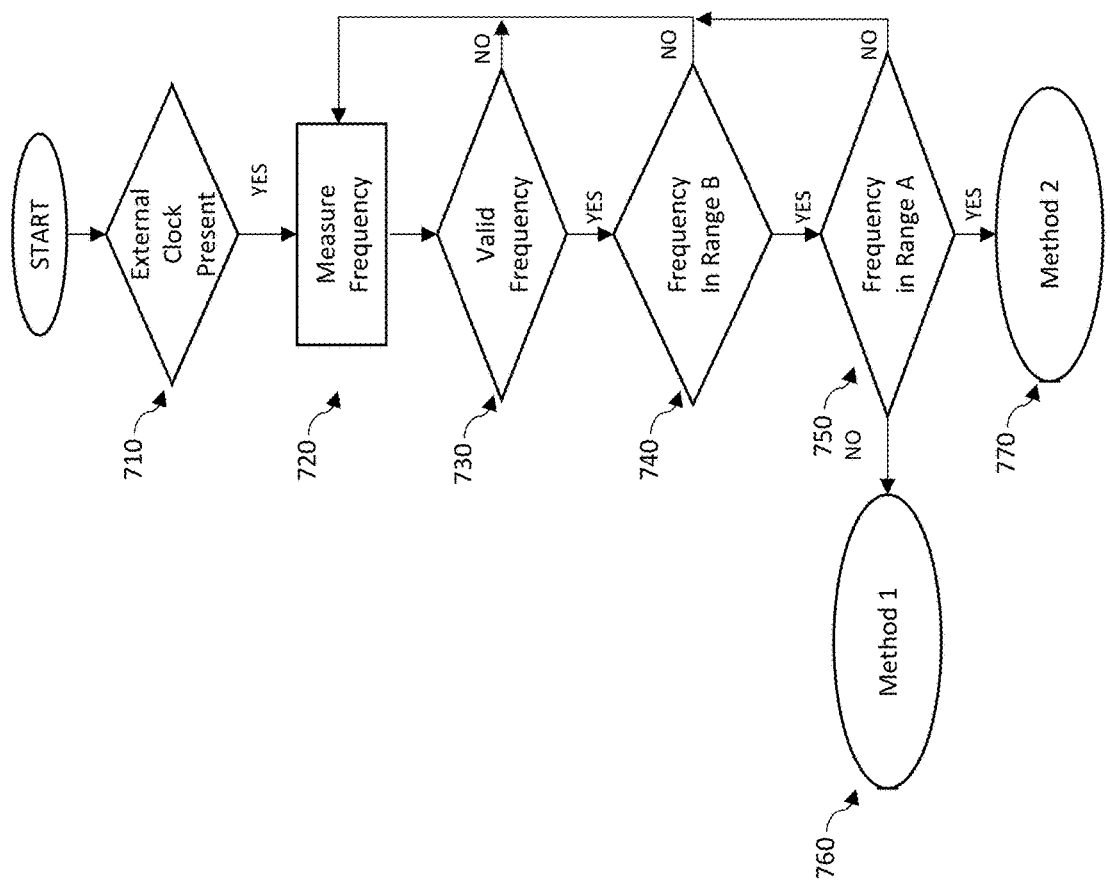
FIG. 7 is a flow chart of a method for determining a clock synchronization method according to a possible implementation of the frequency measure module and method selector module of FIG. 6

A possible method for determining which method of clock synchronization will be used by the clock switch is shown in the flow chart of FIG. 7. In the method, if an external clock is detected 710 (e.g. using a clock detection 210 module), then the frequency of the external clock is measured 720 (e.g., using a frequency measure module 240). If the results are valid 730 (i.e., within an operating bandwidth of the switch) then the frequency compared 740 to a broad range (i.e., range B) and compared 750 to a narrow range (i.e., range A) within (e.g., centered within) the broad range (e.g., using a method selector module 250). The ranges (i.e., range A and range B) are shown in FIG. 2 for a possible implementation. If the frequency measure of the external clock is in range B and not in range A, then method 1 (i.e., wait method) may be determined 760 as the appropriate (i.e., faster) method for clock synchronization. If the frequency measure of the external clock is in range B and also in range A, then method 2 (i.e., adjust-period method) may be determined 770 as the appropriate method for clock synchronization prior to switching.

Figure 8:
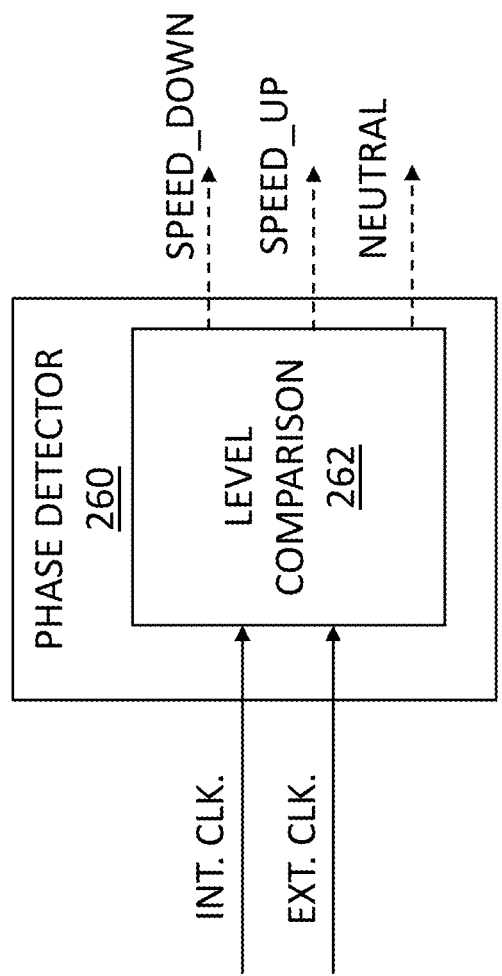
FIG. 8 is a block diagram of a possible phase detector module for the clock switch implementation of FIG. 3.

The clock switch of the possible implementation shown in FIG. 3 also includes a phase detector module 260. The phase detector module 260 is configured to receive the internal clock signal and the external clock signal and determine a relative phase difference. Based on the determined relative phase difference, the phase detector module 260 is configured to generate a signal or signals (e.g., PHASE CTRL) to control the operation of the phase shift module 270. A possible phase detector module 260 is shown in FIG. 8. The phase detector module 260 can include a level comparison subcircuit 262 that is configured to determine a level of the internal clock signal with respect to a level of the external clock signal and based on this determination provide a signal or signals corresponding to an adjustment required for the adjusted internal clock signal to be in sync with the external clock signal. For example, the phase detector module 260 can output a speed down signal (i.e., SPEED_DOWN) when the level comparison subcircuit determines that a portion of the internal clock signal should be lengthened (in time) for synchronization. The phase detector module 260 can output a speed up signal (i.e., SPEED_UP) when the level comparison subcircuit determines that a portion of the internal clock signal should be shortened (in time) for synchronization. The phase detector module 260 can output a neutral signal (i.e., NEUTRAL) as a default condition, such for example, when no external clock is present or when no phase shift is required for synchronization (e.g., when using the wait method).

Figure 9:
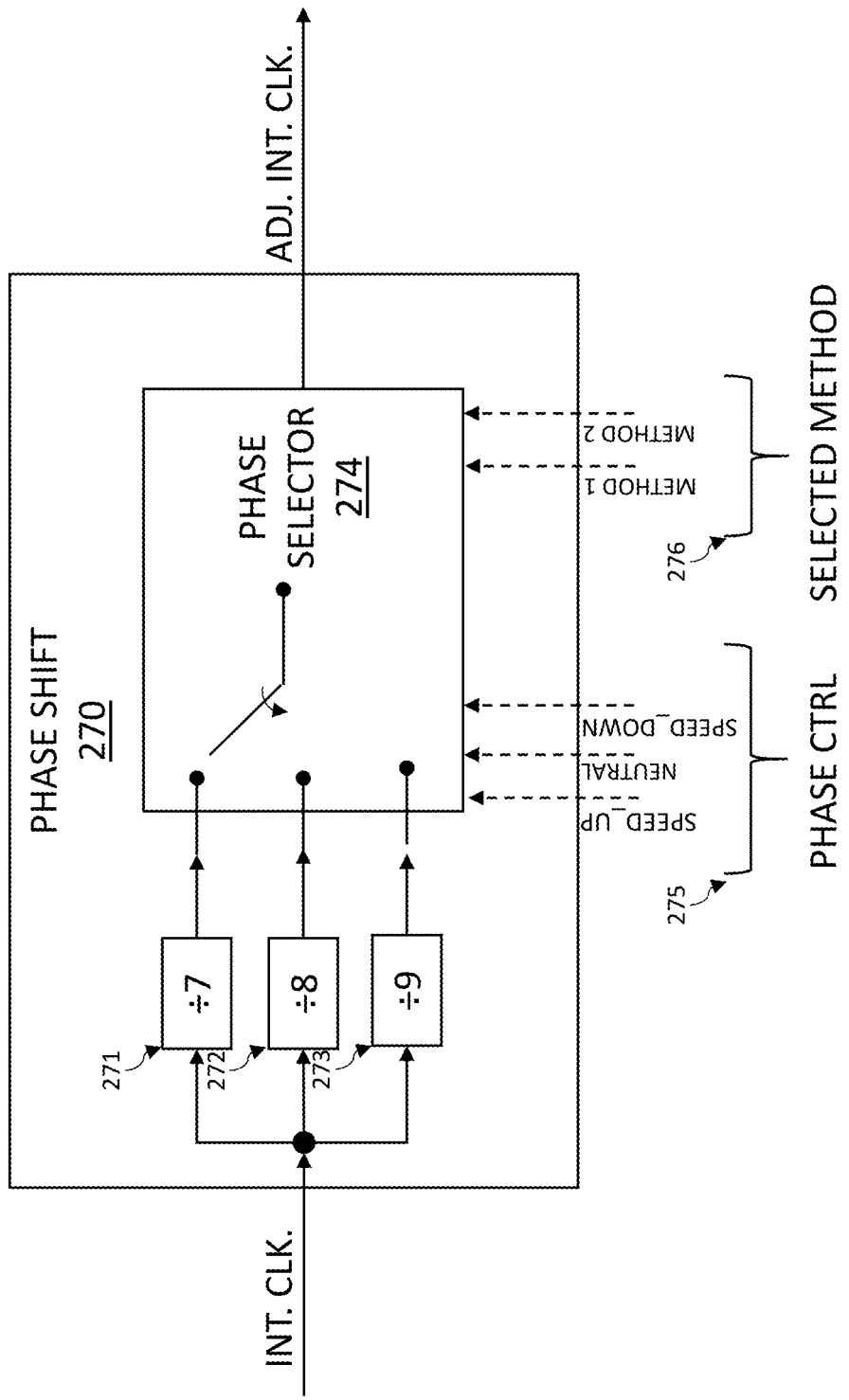
FIG. 9 is a block diagram of a possible phase shift module for the clock switch implementation of FIG. 3.

The clock switch of the possible implementation shown in FIG. 3 also includes a phase shift module 270. The phase shift module 270 generates an adjusted internal clock signal by applying a divide-by function to the internal clock signal. The phase shift module 270 is further configured to produce a period adjustment in the adjusted internal clock signal by changing the characteristics of the divide-by function temporarily. A phase shift module for the clock switch is shown in FIG. 9. The phase shift module can include a plurality of (i.e., a bank of) divide-by subcircuits. Each divide-by subcircuit (i.e., divide-by) is configured to reduce the frequency of an input clock signal by a factor. For the possible implementation shown, the phase shift module includes a divide by 7 ($\div 7$) subcircuit 271 (i.e., a speed-up divide-by), a divide by 8 ($\div 8$) subcircuit 272 (i.e., a neutral divide-by), and a divide by 9 ($\div 9$) subcircuit 273 (i.e., a speed-down divide-by). For example, an internal clock oscillating at a frequency of 17.2 megahertz (MHz) input can be adjusted by the divide by 8 subcircuit 272 to output an adjusted internal clock that oscillates at a frequency of 2.15 MHz.

The frequency of the internal clock can be adjusted to change the phase between an adjusted internal clock and the external clock. Adjusting the phase may include dividing (or multiplying) the internal clock signal by a scalar, factor, or some other parameter. As shown in FIG. 9, the phase shift module 270 is configured to function as a controllable divisor, in which a divisor may be selected from a set of possible divisors. Accordingly, the phase shift module 270 can include a phase selector subcircuit 274 that can be configured to route (i.e., couple) any of the divide-by subcircuits 271, 272, 273 to an output. The choice of which divide-by subcircuit to output (i.e., the state of the phase selector subcircuit 274) may depend on one or more signals corresponding to the selected method 276 and/or on one or more signals corresponding to the determined phase control 275. The divide by 8 subcircuit 272 can correspond to a neutral or default position of the phase selector. For example, when not phase shifting for synchronization, the phase selector may be coupled to the divide by 8 subcircuit 272. Accordingly, when method 1 (i.e. the wait for sync method) is required, the phase selector subcircuit 274 may remain coupled to the divide by 8 subcircuit 272 (i.e., may maintain a neutral divisor). When method 2 (i.e., the adjust period method) is required, the phase selector subcircuit 274 may be (temporarily) adjusted (e.g., by phase control signals 275) to the divide by 7 subcircuit 271 or adjusted to the divide by 9 subcircuit 273. The divide by 7 subcircuit 271 corresponds to speeding up the clock signal (i.e., to the SPEED_UP signal) and the divide by 7 subcircuit 271 corresponds to speeding down the clock signal (i.e., to the SPEED_DOWN signal).

The phase shift module 270 may change (i.e., adjust, shift, etc.) a phase of the adjusted internal clock signal relative a phase of the external clock signal. The phase of the adjusted internal clock signal may be controlled in a first direction (i.e., relative to the external clock phase) by speeding up (e.g., shortening a portion of) adjusted clock signal for a number of internal clock cycles. Likewise, the phase of the adjusted internal clock may by be controlled in a second direction (i.e., opposite to the first direction) by speeding down (e.g., lengthening a portion of) the adjusted clock signal for the number of internal clock cycles. The number of internal clock cycles that a neutral clock (i.e. a ÷8 adjusted internal clock signal) is sped up or sped down can corresponds to the amount (i.e. magnitude) of a resulting phase shift in the neutral clock signal. Further, in some implementations, this process of speeding up or speeding down the adjusted internal clock may be repeated to incrementally increase or adjust a phase difference between the clock signals. For example, a portion (e.g., a HIGH portion) of the adjusted internal clock signal may be lengthened by a fixed number of internal clock cycles. This lengthening by a fixed number of internal clock cycles may be repeated on successive clock cycles (i.e. on successive HIGH portions) until a phase match condition is met.

Figure 10:
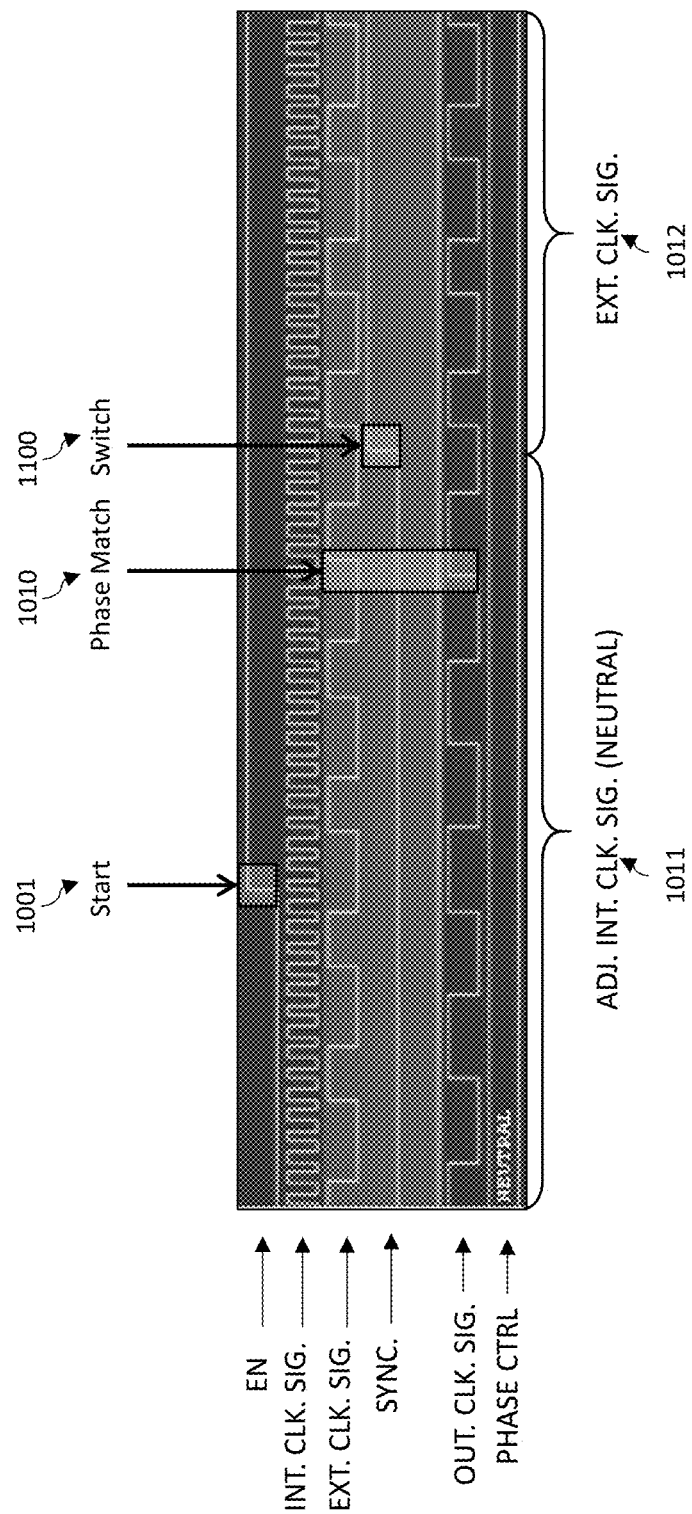
FIG. 10 is a timing diagram of signals associated with an implementation of the first method (i.e., wait for synchronization) for clock synchronization.

FIG. 10 is a timing diagram of signals associated with an implementation of the first method (i.e., wait for synchronization) applied to clock switching. Previously, the external clock has been detected and measured as valid. Then, an enable signal (i.e., EN) triggers (e.g., by transitioning from LOW to HIGH) a start 1001 of a process to switch the output clock signal (i.e., OUT. CLK. SIG.) from a neutral adjusted internal clock signal (i.e. ADJ. INT. CLK. SIG. (neutral)) to an external clock signal (i.e., EXT. CLK. SIG.). The neutral adjusted internal clock signal can be the internal clock signal (i.e., INT. CLK. SIG.) divided by a default (i.e., neutral) factor (e.g., ÷8).

Prior to switching the clock signals must be synchronized to reduce or eliminate artifacts. For the implementation shown in FIG. 10, method 1 (i.e. the wait for synchronization method) has been selected for the synchronization. Accordingly, a phase between the external clock signal and the output clock signal (OUT. CLK. SIG.) is measured until it is found to a phase match (i.e., found to be within a matching threshold). It should be noted that before switching, the output clock signal is equivalent to the neutral internal clock signal.

As shown in FIG. 10, after a phase match is determined, a synchronization signal (i.e., SYNC) triggers (e.g., by transitioning LOW to HIGH) the multiplexer to switch 1100 from the adjusted internal clock signal to the external clock. The SYNC signal to enable the switching may occur after the phase match is determined 1010 so that both the external clock signal and the adjusted internal clock signal are LOW at the time of switching. Prior to switching 1100 the output clock signal is the adjusted internal clock signal 1011 and after switching 1100 the clock signal is the external clock signal 1012. The phase control signal (PHASE CTRL) that configures the phase shift module 270 are always in the neutral (e.g., ÷8) state because no period adjustment is necessary in method 1. As shown in FIG. 10, despite the adjusted internal clock signal 1011 and the external clock signal 1012 not being identical, there are no artifacts created in the output clock signal due to switching.

Figure 11:
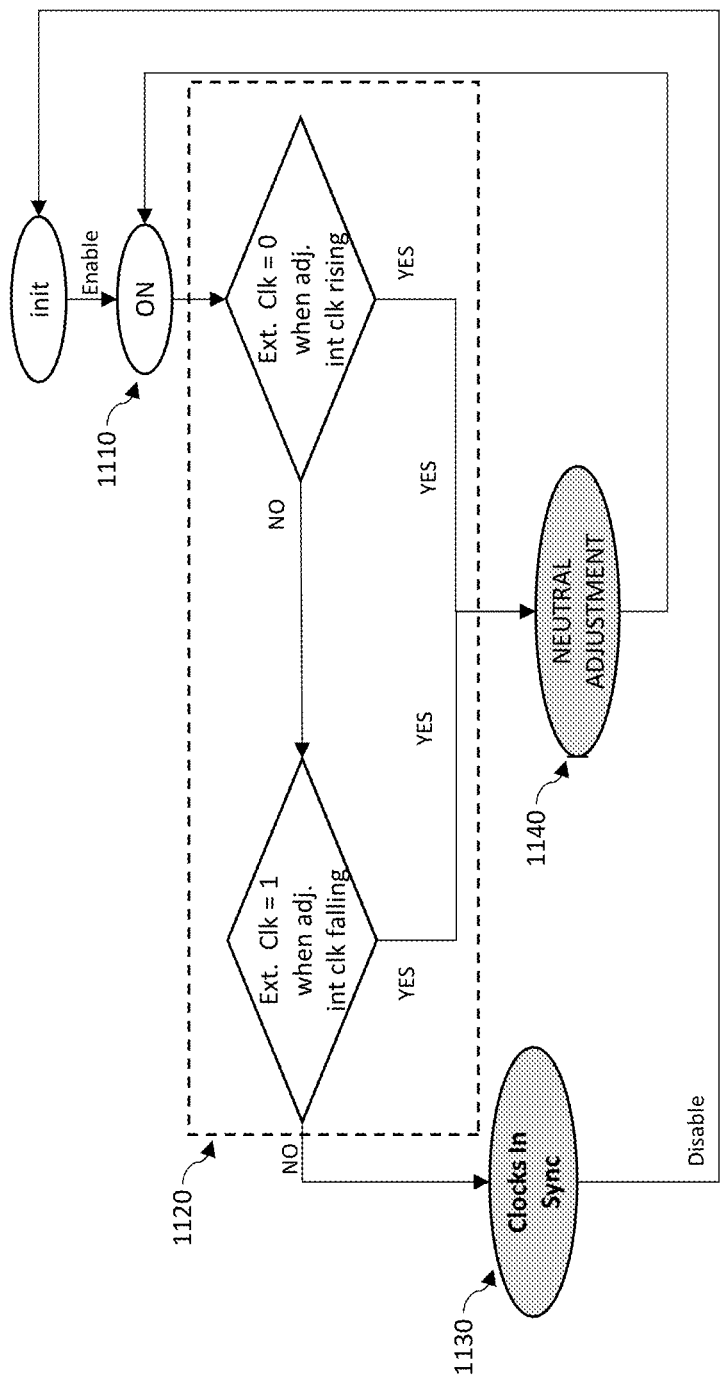
FIG. 11 is a flow chart of a first method (method 1) for synchronizing clock signals before switching according to a possible implementation of the present disclosure.

FIG. 11 is a flow chart of a first method (method 1) for synchronizing clock signals according to a possible implementation of the present disclosure. At the start of the method, an external clock signal enables (i.e., turns ON, triggers, activates, etc.) the clock switch. The external clock signal and the adjusted internal clock have been compared 1120 (i.e., at a current clock cycle) to determine a phase condition. If the phase condition is a phase match, then the clocks are in sync 1130 and the method concludes (i.e. the search for a phase match is disabled). If a phase match is not found, the internal clock signal receives a neutral adjustment and the process repeats on subsequent clock cycles. The phase condition for a clock cycle is a phase match when (i) the external clock is not LOW (i.e., CLK=0) at a rising edge of the adjusted internal clock and (ii) the external clock is not HIGH (i.e., CLK=1) at a falling edge of the adjusted internal clock. When these conditions occur, clocks are phase matched (i.e., synchronized, in sync) and a synchronization condition has been determined.

Figure 12:
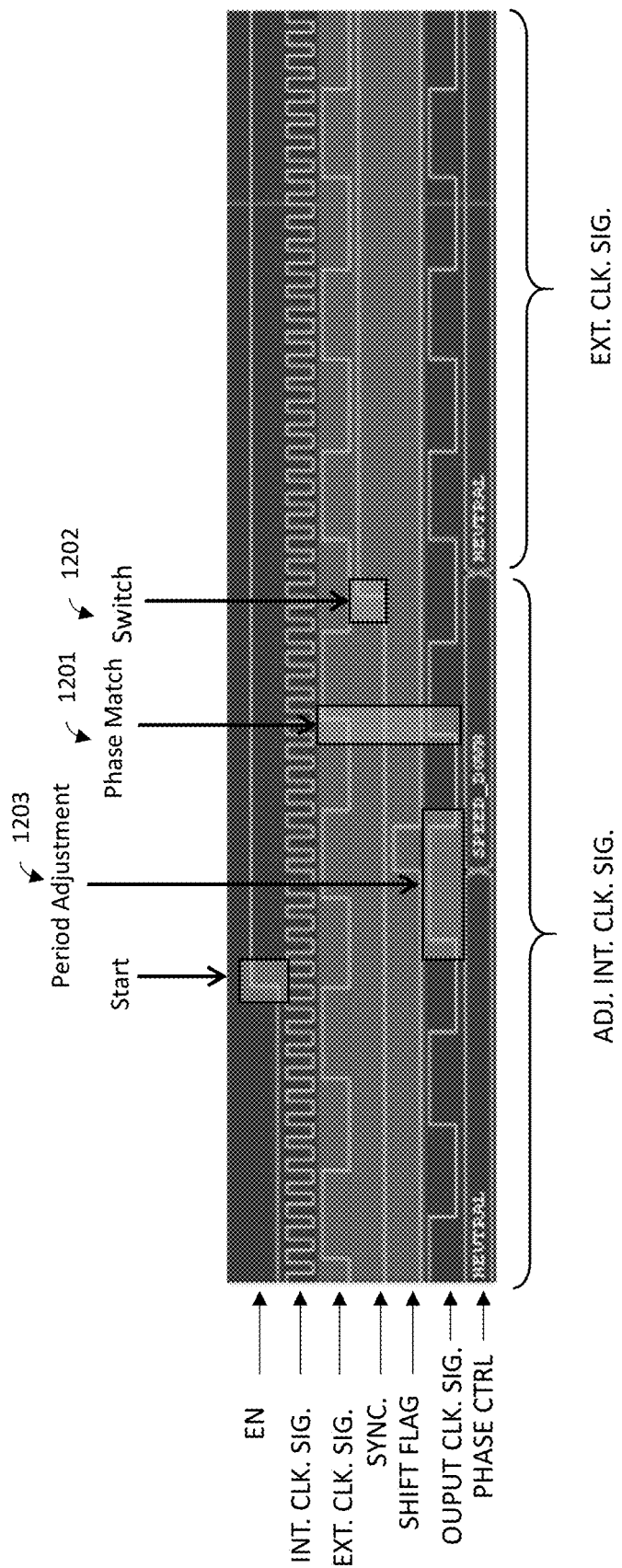
FIG. 12 is a timing diagram of signals associated with the second method (method 2) for clock synchronization, the signals illustrating a speed down period adjustment.

FIG. 12 is a timing diagram of signals associated with a first possible implementation of the method 2 (i.e., the adjust period method) for synchronizing the clock signals prior to switching. For the example shown, it has been determined (e.g., by the operation of a phase detector module 260) that the adjusted internal clock signal should have at least one period lengthened (i.e., slowed down, sped down) in order to achieve a phase match (i.e., synchronization) between the external clock signal and the adjusted internal clock signal (i.e., adjusted neutrally). Accordingly, phase control signals are produced that control the phase shift module 270 to lengthen (i.e., speed down) a period of the clock output by the clock switch by switching (for a fixed number of internal clock cycles) from a neutral divisor (÷8) to a speed-down divisor (÷9) and then back to the neutral divisor (÷8). The output clock signal shown in FIG. 12 includes a portion (i.e., a HIGH portion) that is lengthen by a fixed period according to a shift flag signal (i.e., SHIFT FLAG). As shown, the shift flag signal (with duration of two periods of the internal clock signal) report that the system has adjusted output clock signal. After the application of one period adjustment, a phase match 1201 is concluded between the clock signals. Accordingly, after the phase match determination the sync signal triggers a switch 1202 when both clock signals are LOW. The output clock signal is thus switched with no artifacts other than the period adjustment 1203 of a single clock cycle for the period adjustment.

Figure 13:
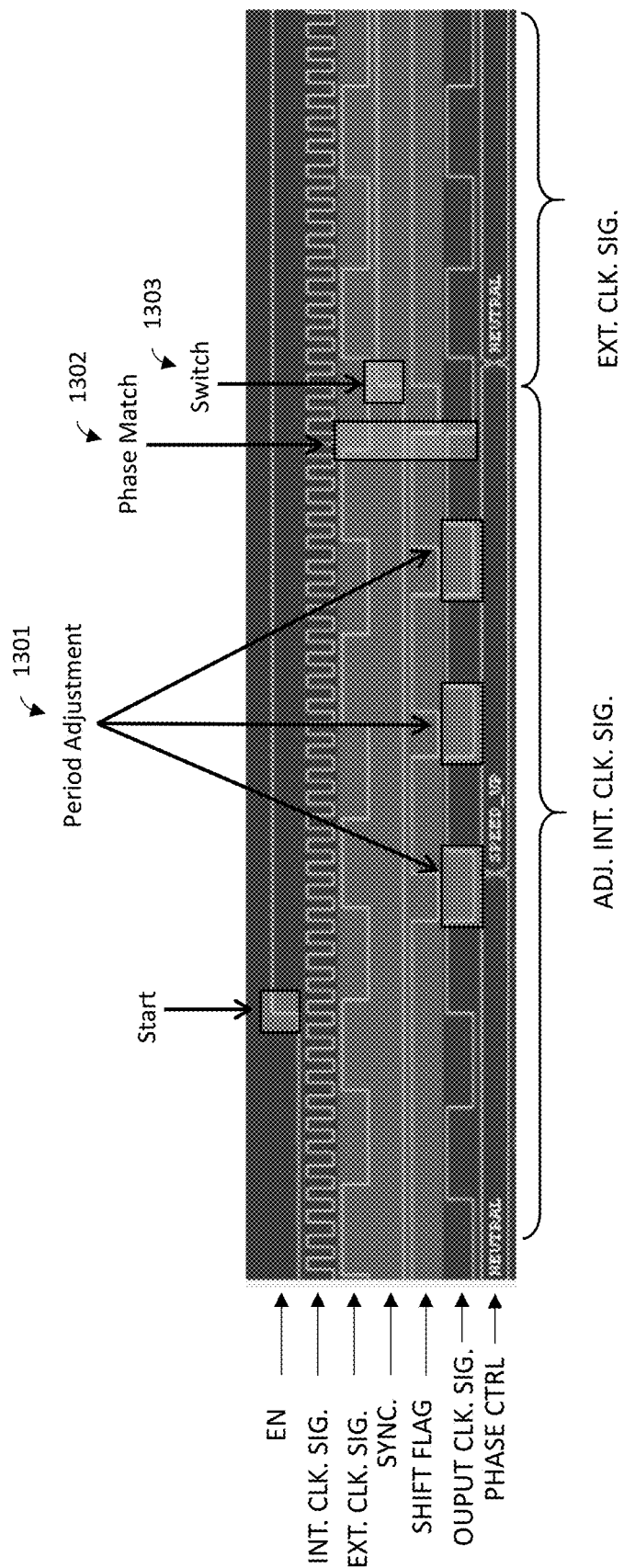
FIG. 13 is a timing diagram of signals associated with the second method (method 2) for clock synchronization, the signals illustrating multiple speed up adjustments.

FIG. 13 is a timing diagram of signals associated with a second possible implementation of the method 2 (i.e., the adjust period method) for synchronizing clock signals prior to switching. For the example shown, it has been determined (e.g., by the operation of a phase detector module 260) that the adjusted internal clock signal should have at least one period shortened (i.e., sped up) in order to achieve a phase match (i.e., synchronization) between the external clock signal and the adjusted internal clock signal. Accordingly, phase control signals are produced that control the phase shift module 270 to shorten (i.e., speed up) a period of the clock output by the clock switch by switching (for a fixed number of internal clock cycles) from a neutral divisor (÷8) to a speed-up divisor (÷7) and then back to the neutral divisor (÷8). The output clock signal shown in FIG. 12 includes a portion (a LOW portion) that is shortened in time (i.e., according to a shift flag in a LOW state). After the application of a first period adjustment 1301, no phase match is concluded between the clock signals. Accordingly, the process is repeated at the next clock cycle and no phase match is determined. The process is repeated a third time at the following clock cycle and after this period adjustment 1301, a phase match 1302 is determined. Accordingly, after the phase match determination, the sync signal triggers a switch 1303 while both clock signals are LOW. The output clock signal is thus switched with no artifacts other than the period adjustment of a three clock cycles for the period adjustment 1301.

Figure 14:
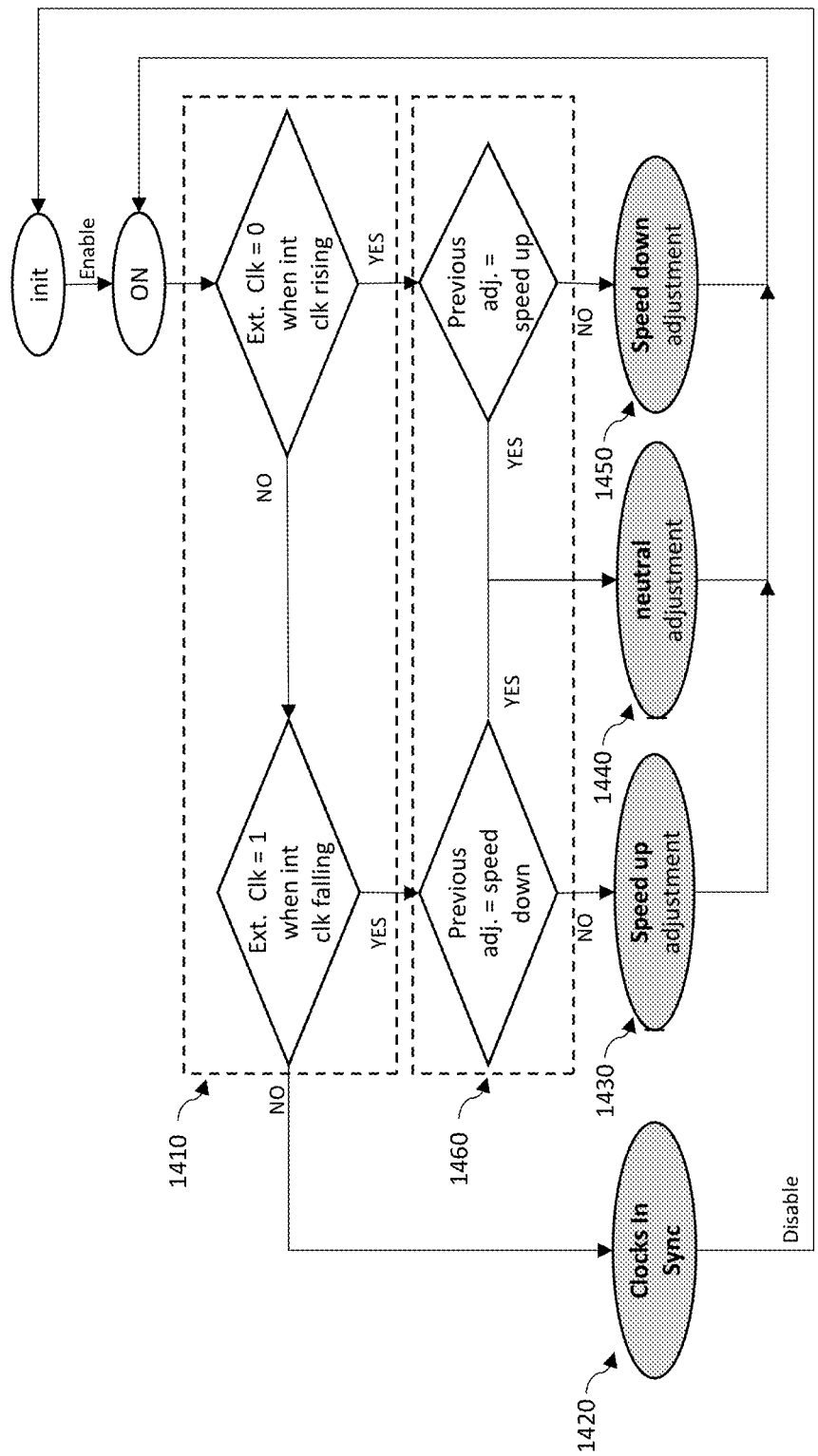
FIG. 14 is a flow chart of a second method (method 2) for synchronizing clock signals before switching according to a possible implementation of the present disclosure.

FIG. 14 is a flow chart of a method 2 (i.e., the adjust period method) for synchronizing clock signals before switching according to a possible implementation of the present disclosure. As in method 1 (see FIG. 11) the method includes decision blocks to determine if the clocks are phase matched (i.e., determine a synchronization condition) 1410. If a phase match is determined, then the clocks are determined to be synchronized 1420. If a phase match is not determined, then a period adjustment is applied. The method may apply three types of period adjustment to the internal clock signal (i.e., via the phase shift module 270): a speed up (÷7) adjustment 1430, a neutral (÷8) adjustment (i.e., no adjustment) 1440, or a speed down adjustment (÷9) 1450. The selection of which is determined by a previously selected adjustment (i.e., divisor) 1460. The previous period adjustment (i.e., for a previous clock cycle) is considered to prevent overshoots and help to iteratively converge on a solution. Accordingly, iterations of the period adjust process may iteratively apply the same adjustment or may iteratively go back and forth between different adjustments before a phase match is found.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It will be understood that, in the foregoing description, when an element, such as a component is referred to as connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements present. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A clock switch, comprising:
a phase shift module configured to receive an internal clock signal from an internal clock coupled to the clock switch, the phase shift module configured to reduce a frequency of the internal clock signal by a controllable divisor to generate an adjusted internal clock signal;
a clock-sync controller configured to receive an external clock signal from an external clock coupled to the clock switch, the external clock signal at a frequency different from the adjusted internal clock signal, the clock-sync controller configured to control the controllable divisor of the phase shift module, according to a first method or a second method, in order to synchronize the adjusted internal clock signal with the external clock signal in a time that is shortest by the first method or the second method, the clock-sync controller including a frequency measure module configured to measure a frequency difference between the internal clock and the external clock signal; and
a multiplexer configured to switch an output of the clock switch between the adjusted internal clock signal and the external clock signal upon receiving a sync signal from the clock-sync controller, the sync signal generated by the clock-sync controller after the adjusted internal clock signal is synchronized with the external clock signal.

2. The clock switch according to claim 1, wherein the clock-sync controller includes a method selector module configured to select the first method or the second method for controlling the controllable divisor of the phase shift module, the selection based on the frequency difference.

3. The clock switch according to claim 2, wherein the first method includes maintaining the controllable divisor as a neutral divisor.

4. The clock switch according to claim 2, wherein the second method includes temporarily controlling the controllable divisor from a neutral divisor to a speed-up divisor.

5. The clock switch according to claim 2, wherein the second method includes temporarily controlling the controllable divisor from a neutral divisor to a speed-down divisor.

6. The clock switch according to claim 1, wherein the clock-sync controller includes a phase detector module configured to determine a phase difference between an internal clock signal and the external clock signal and to provide phase control signals to control the controllable divisor of the phase shift module based on the phase difference.

7. The clock switch according to claim 1, wherein the clock-sync controller includes a clock-sync detection module that is configured to generate the sync signal after determining a phase match condition between the adjusted internal clock signal and the external clock signal.

8. The clock switch according to claim 7, wherein the sync signal is generated by the clock-sync detection module at a time after determining a phase match condition when the adjusted internal clock signal and the external clock signal are both at a low signal level.

9. The clock switch according to claim 1, wherein the phase shift module includes:
a bank of divide-by subcircuits, each divide-by subcircuit in the bank coupled to an input of the phase shift module; and
a phase selector configurable to route one of the divide-by subcircuits to an output of the phase shift module.

10. The clock switch according to claim 1, further including a clock detection module configured to enable the phase shift module and the clock-sync controller upon detecting the external clock signal from the external clock.

11. The clock switch according to claim 1, wherein the switching of the output of the clock switch between the adjusted internal clock signal and the external clock does not cause artifacts in an output clock signal of the clock switch.

12. The clock switch according to claim 1, wherein the internal clock or the external clock is a spread spectrum clock.

13. A method for switching clock signals, the method comprising:
receiving an internal clock signal from an internal clock;
changing a frequency of the internal clock signal by a factor to generate an adjusted internal clock signal;
receiving an external clock signal from an external clock, the external clock signal at a frequency different from the adjusted internal clock signal;
applying the adjusted internal clock signal and the external clock signal to a multiplexer, the multiplexer configured to couple the adjusted internal clock signal to an output;
measuring a frequency difference between the internal clock signal and the external clock signal;
selecting a first method or a second method to synchronize the adjusted internal clock signal with the external clock signal based on the frequency difference and based on a time to synchronization;
executing the selected method until a synchronization condition is determined; and
switching the multiplexer to couple the external clock signal to the output after the synchronization condition is determined.

14. The method for switching clock signals according to claim 13, wherein the changing a frequency of the internal clock signal by a factor to generate an adjusted internal clock signal includes:
selecting a divisor from a set of possible divisors, the set of possible divisors including a neutral divisor, a speed-up divisor, and a speed-down divisor; and
dividing the frequency of the internal clock signal by the divisor.

15. The method for switching clock signals according to claim 14; wherein the selected method is the first method and the executing the selected method until a synchronization condition is determined includes:
dividing the frequency of the internal clock signal by the neutral divisor;
determining a phase condition of a current clock cycle, the phase condition between the adjusted internal clock signal and the external clock signal; and
repeating the dividing and determining for subsequent clock cycles until the phase condition is a phase match.

16. The method for switching clock signals according to claim 14; wherein the selected method is the second method and the executing the selected method until a synchronization condition is determined includes:
dividing the frequency of the internal clock signal by the speed-up divisor or the speed-down divisor based on a phase condition of a previous clock cycle and based on a previously selected divisor;
determining a phase condition of a current clock cycle, the phase condition between the adjusted internal clock signal and the external clock signal; and
repeating the dividing and determining for subsequent clock cycles until the phase condition is a phase match.

17. The method for switching clock signals according to claim 14; wherein the selecting a first method or a second method to synchronize the adjusted internal clock signal with the external clock signal based on the frequency difference includes:
determining which method can reach synchronization in fewer clock cycles.

18. A synchronous device comprising:
an internal clock configured to provide an internal clock signal;
a port capable of coupling to an external clock; and
a clock switch coupled to the internal clock and to the port, the clock switch including circuitry configured to:
reduce a frequency of the internal clock signal by a controllable divisor to generate an adjusted internal clock signal;
couple the adjusted internal clock signal to an output of the clock switch;
detect an external clock signal at the port, the external clock signal at a frequency different from the adjusted internal clock signal;
control the controllable divisor, according to a first method or a second method, to synchronize the adjusted internal clock signal with the external clock signal in a time that is shortest by the first method or the second method, the clock switch configured to determine the method used by comparing a frequency of the internal clock signal and a frequency of the external clock signal; and switch the clock switch to couple the external clock signal to the output after the adjusted internal clock signal is synchronized with the external clock signal.

19. The method for switching clock signals according to claim 13, wherein the selecting is based on the time to synchronization being shortest by the first method or the second method.

\* \* \* \* \*